(12) United States Patent
Khwa et al.

(10) Patent No.: US 12,057,182 B2
(45) Date of Patent: Aug. 6, 2024

(54) MULTI-LEVEL CELL DATA ENCODING

(71) Applicant: Taiwan Semiconductor Manufacturing Company, Ltd., Hsinchu (TW)

(72) Inventors: Win-San Khwa, Taipei (TW); Jui-Jen Wu, Hsinchu (TW); Jen-Chieh Liu, Hsinchu (TW); Meng-Fan Chang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 238 days.

(21) Appl. No.: 17/591,270

(22) Filed: Feb. 2, 2022

(65) Prior Publication Data

US 2023/0037044 A1 Feb. 2, 2023

Related U.S. Application Data

(60) Provisional application No. 63/227,718, filed on Jul. 30, 2021.

(51) Int. Cl.
*G11C 29/12* (2006.01)
*G11C 11/54* (2006.01)
*G11C 29/02* (2006.01)
*G11C 29/42* (2006.01)
*G11C 29/44* (2006.01)

(52) U.S. Cl.
CPC .......... *G11C 29/1201* (2013.01); *G11C 11/54* (2013.01); *G11C 29/026* (2013.01); *G11C 29/42* (2013.01); *G11C 29/4401* (2013.01)

(58) Field of Classification Search
None
See application file for complete search history.

(56) References Cited

U.S. PATENT DOCUMENTS

| | | | | |
|---|---|---|---|---|
| 11,314,592 | B2* | 4/2022 | Song | G06F 11/1068 |
| 2010/0115176 | A1* | 5/2010 | Sarin | G11C 8/10 |
| | | | | 365/185.17 |
| 2011/0296273 | A1* | 12/2011 | Rub | G11C 16/3427 |
| | | | | 714/755 |
| 2012/0203951 | A1* | 8/2012 | Wood | G11C 29/42 |
| | | | | 711/E12.008 |
| 2012/0294094 | A1* | 11/2012 | Ling | G11C 29/785 |
| | | | | 365/189.011 |
| 2015/0117107 | A1* | 4/2015 | Sun | G11C 16/225 |
| | | | | 365/185.12 |
| 2016/0085612 | A1* | 3/2016 | Liu | G06F 11/073 |
| | | | | 714/6.13 |
| 2016/0216910 | A1* | 7/2016 | Phan | G06F 3/0604 |

\* cited by examiner

*Primary Examiner* — Guerrier Merant
(74) *Attorney, Agent, or Firm* — MERCHANT & GOULD P.C.

(57) ABSTRACT

A system includes a memory cell array including multi-level cells, an input data scramble circuit configured to receive input data and match lower error tolerant bits with higher error tolerant bits to provide matched bit sets, wherein each of the matched bit sets includes at least one lower error tolerant bit and at least one higher error tolerant bit, and a write driver configured to receive the matched bit sets and store each of the matched bit sets into one memory cell of the multi-level cells.

20 Claims, 7 Drawing Sheets

MULTI-LEVEL CELL DATA ENCODING

CROSS-REFERENCE TO RELATED APPLICATIONS

This application claims the benefit of U.S. Provisional Patent Application No. 63/227,718, filed on Jul. 30, 2021, the disclosure of which is incorporated by reference in its entirety.

BACKGROUND

Multi-level cells (MLCs) are memory cells that can store more than one bit of information or data per memory cell, as opposed to single-level cells (SLCs) that can store only one bit of data per memory cell. MLC memory reduces the number of metal-oxide-semiconductor field-effect transistors (mosfets) needed per bit of data stored in the memory, which increases data storage density of the memory. MLCs can be configured to store two bits of data per memory cell, three bits of data per memory cell, or more than three bits of data per memory cell. Also, MLCs can be used in a variety of applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

DETAILED DESCRIPTION

Figure 1:
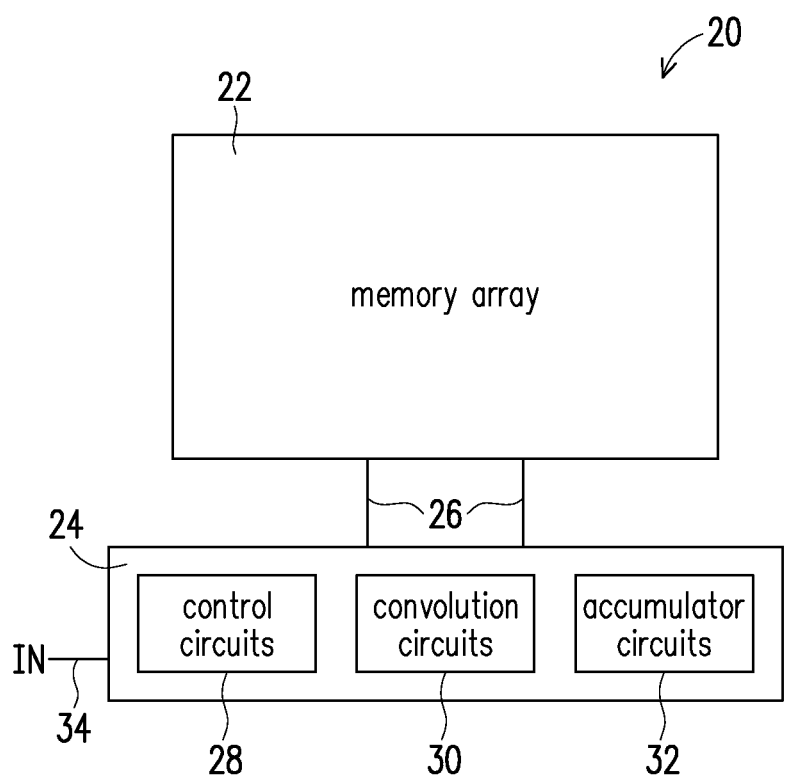
FIG. 1 is a diagram schematically illustrating a memory device that includes a memory array and memory device circuits configured to group lower error tolerant bits with higher error tolerant bits in the memory array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Disclosed embodiments provide MLC memory and MLC data encoding and decoding that is used to balance memory device reliability requirements. Disclosed embodiments provide systems and methods for balancing memory device reliability requirements by grouping together bits of data that are opposite in sensitivity to errors, where errors on bits with lower error tolerance have a larger negative impact on overall system performance and errors on bits with higher error tolerance have a smaller negative impact on overall system performance. Also, disclosed embodiments provide systems and methods for balancing memory device reliability requirements for convolutional neural networks (CNNs).

Disclosed embodiments include compute-in-memory (CIM) systems and methods that include MLC memory. The CIM systems and methods store information in the MLC memory and perform calculations in the memory device, as opposed to moving data between the memory device and another device for various computational steps. In the CIM systems and methods, data is accessed more quickly from the MLC memory than from other storage devices and analyzed more quickly in the memory device. This enables faster reporting and decision-making in business and machine learning applications. In some embodiments, the CIM systems and methods include circuits that provide CNN functions.

In some embodiments, CNNs, also referred to as ConvNets, specialize in processing data that has a grid-like topology, such as digital image data that includes binary representations of visual images. The digital image data includes pixels arranged in a grid-like topology, which contain values denoting image characteristics, such as color and brightness. The CNNs can be used to analyze visual images in image recognition applications. The CNNs include an input layer, an output layer, and a hidden layer that includes multiple convolution layers, pooling layers, fully connected layers, and scaling/normalization layers. Where convolution layers can include performing convolutions and/or performing cross-correlations. Also, in some embodiments, in the CNNs, input data is interacted with weights to provide results, where the weights are stored in and retrieved from the MLC memory. Efforts are ongoing to improve the performance of CIM systems and CNNs.

Trained CNN weights usually exhibit a non-uniform distribution, such as a Gaussian distribution. In the non-uniform distribution, the weights at the center of the distribution have a higher probability of occurring than the weights at the extremes of the distribution. Also, often the weights are represented in 2 s complement form, such that weights at the center of the distribution are basically centered around zero, where moving away from zero in one direction provides non-negative (positive) integers, such as 0 to 7, and moving away from zero in the other direction provides negative integers, such as −1 to −8. This results in many changes in the least significant bits and fewer or no changes in the most significant bits. For example, with an 8-bit weight in 2 s complement form, changing between 0 and 7 changes the three least significant bits but leaves the five most significant bits unchanged at all zeroes, and changing between −1 and −8 changes the three least significant bits but leaves the five most significant bits unchanged at all ones.

With 8-bit weights stored in four 2-bit MLCs in the following data representation (W[7:6], W[5:4], W[3:2], W[1:0]) the bit distribution contains a disproportionate number of 00 and 11 bit patterns. Further, each bit of the 8-bit weight has a different impact on the overall inference accuracy of the CNN. The most sensitive bits, those with the lowest error tolerance having a larger negative impact on overall system performance, are W[7] and W[6] and the least sensitive bits, those with the highest error tolerance having a smaller negative impact on overall system performance, are W[1] and W[0]. The data representation of (W[7:6], W[5:4], W[3:2], W[1:0]) groups two bits together that are the most sensitive, i.e., W[7] and W[6], and two bits together that are least sensitive, i.e. W[1] and W[0]. This is an unbalanced representation, such that if one of the MLCs fails and provides errors, then the overall system performance will be greatly affected by the loss of W[7] and W[6] and barely affected by the loss of W[1] and W[0]. This is not optimized, such that it does not balance memory device reliability requirements.

Disclosed embodiments include grouping lower error tolerant bits with higher error tolerant bits. Also, disclosed embodiments provide data scramble techniques for MLC memory that pair an error sensitive bit with an error insensitive bit to relax memory device reliability requirements. These embodiments exploit the asymmetric error tolerance of bits in the weights of CNNs to improve the inference accuracy of the CNN via MLC data encoding. For example, by storing an 8-bit weight in four 2-bit MLCs, where each MLC stores two bits having opposite error sensitivities, such as (W[7:0], W[6:1], W[5:2], and W[4:3]), memory device reliability requirements are balanced. Also, the number of MLCs having each of the bit patterns of 00, 01, 11, and 10 is balanced.

It should also be noted that this method is not limited to an 8-bit weight using four two-bit MLC devices. In other embodiments, each weight can be more or less than eight bits and/or each MLC can store more than two bits. Also, embodiments of the disclosure can be used in multiple different technology generations, i.e., at multiple different technology nodes and, embodiments of the disclosure, can be adapted to several different memory devices.

FIG. 1 is a diagram schematically illustrating a memory device 20 that includes a memory array 22 and memory device circuits 24 configured to group lower error tolerant bits with higher error tolerant bits in the memory array 22, in accordance with some embodiments. The memory array 22 is electrically coupled to the memory device circuits 24 via communication paths 26. In some embodiments, the memory array 22 includes an MLC memory array that is configured to store CNN weights.

In some embodiments, the memory device 20 is a CIM memory device that includes the memory array 22 situated above or on top of the memory device circuits 24. In some embodiments, the memory device 20 is a CIM memory device that includes memory device circuits 24 configured to provide functions for applications, such as a CNN application. In some embodiments, the memory array 22 is a back-end-of-line (BEOL) memory array situated above the memory device circuits 24 that are front-end-of-line (FEOL) circuits. In other embodiments, the memory array 22 can be situated on the same level or below/underneath the memory device circuits 24. In some embodiments, the memory device 20 can be a CIM memory device that includes memory device circuits 24 configured to provide other functions, such as functions for modeling complex systems, such as systems for predicting the weather.

In some embodiments, in CNN applications, input data is interacted with weights to provide results, where the weights are stored in and retrieved from MLC memory. These results can be inferences about what an image of interest depicts. The CNN learns what different images depict in an iterative learning process by examining many different images and adjusting or updating the weights to distinguish between the different images. This is referred to as training the weights, such that the trained weights, i.e., iteratively updated weights, provide improved inference results for the CNN.

These trained CNN weights usually exhibit a non-uniform distribution, such that the weights at the center of the distribution have a higher probability of occurring than the weights at the extremes of the distribution. Also, often the trained weights are represented in 2 s complement form, such that the trained weights at the center of the distribution are, basically, centered around zero, i.e., a string of all zero bits. In 2 s complement form, non-negative (positive) integers such as 0 to 7 are represented with the five most significant bits as zeroes and toggling of the three least significant bits, and negative integers such as −1 to −8 are represented with the five most significant bits as ones and toggling of the three least significant bits. This results in many changes in the least significant bits and fewer or no changes in the most significant bits. For example, with an 8-bit weight in 2 s complement form, counting between 0 and 7 changes the three least significant bits of W[0], W[1], and W[2], but leaves the five most significant bits of W[7], W[6], W[5], W[4], and W[3] unchanged at all zeroes, and counting between −1 and −8 changes the three least significant bits of W[0], W[1], and W[2], but leaves the five most significant bits of W[7], W[6], W[5], W[4], and W[3] unchanged at all ones.

Also, each bit of the 8-bit weight has a different impact on the overall inference accuracy of the CNN. Lower error tolerance bits are the most sensitive bits, such that if these bits are inadvertently changed, the change has a larger negative impact on overall system performance. Higher error tolerance bits are the least sensitive bits, such that if these bits are inadvertently changed, the change has a smaller negative impact on overall system performance. In the CNN 8-bit weight example, the lowest error tolerant bit is W[7] followed by W[6], and so on, down to the highest error tolerant bit of W[0]. With an 8-bit weight stored in four 2-bit MLCs in the data representation of (W[7:6], W[5:4], W[3:2], W[1:0]), the two most sensitive bits of W[7] and W[6] are grouped together and the two least sensitive bits of W[1] and W[0] are grouped together. This is an unbalanced representation, such that if one of the MLCs fails, the overall system performance may be either greatly affected by the loss of W[7] and W[6] or barely affected by the loss of W[1] and W[0].

In the present memory device 20, the memory device circuits 24 include circuits for grouping lower error tolerant bits, such as the most significant bits, with higher error tolerant bits, such as the least significant bits. In some embodiments, the memory device circuits 24 include data scramble circuits that provide data scramble techniques for grouping lower error tolerant bits with higher error tolerant bits. In some embodiments, the memory device circuits 24 include data scramble circuits that provide data scramble techniques for pairing a lower error tolerant bit with a higher error tolerant bit and storing the paired bits in a 2-bit MLC. In some embodiments, the memory device circuits 24 are configured to scramble (encode) input data, such as CNN weights, write the scrambled data into the MLC memory of the memory array 22, read data out of the MLC memory of the memory array 22, unscramble (decode) the data read out of the memory array 22, and provide CNN functions in the memory device 20. In some embodiments, the memory device circuits are also configured to provide other functions, such as functions for modeling complex systems, such as systems for predicting the weather.

The memory device circuits 24 include control circuits 28, convolution circuits 30, and accumulator circuits 32. The control circuits 28 are configured to control functions of the memory device 20. The control circuits 28 include: circuits for addressing MLCs in the memory array 22, such as row select circuits and column select circuits; circuits for scrambling input data; circuits for writing data into the MLCs; circuits for sensing signals from the MLCs and reading data out of the MLCs; circuits for performing analog-to-digital conversions on the signals sensed from the MLCs; circuits for unscrambling data read from the MLCs; and circuits for multiplexing signals to the convolution circuits 30 and the accumulator circuits 32. In some embodiments, the control circuits 28 include other circuits for performing other functions of the memory device 20.

In some embodiments, the memory device 20 receives input data IN at input terminal 34 and reads CNN weights from the MLCs in the memory array 22. The convolution circuits 30 interact the input data and the weights obtained from the memory array 22 to provide interacted results. The accumulator circuits 32 receive the interacted results from the convolution circuits 30 and accumulate the interacted results to provide accumulated results.

In some embodiments, the convolution circuits 30 perform a convolution that is a linear operation that involves the multiplication of a set of the CNN weights with the input data IN. In some embodiments, the multiplication is performed between an array of input data IN and a two-dimensional or a three-dimensional array of CNN weights, referred to as a kernel or a filter. The filter is smaller than the input data IN and the type of multiplication applied between a filter-sized patch of the input data IN and the filter is a dot product. The dot product is the element-wise multiplication between the filter-sized patch of the input data IN and the filter producing partial products that are summed by the accumulator circuits 32, resulting in a single value, referred to as the scalar product. Using a filter smaller than the input data IN is intentional as it allows the same filter, i.e., the same set of weights, to be multiplied by the input data array multiple times at different points on the input data IN, where the filter is applied systematically to each overlapping part or filter-sized patch of the input data, left to right, top to bottom, and front to back. In some embodiments, the convolution circuits 30 include one or more multiplier circuits configured to multiply the input data and the weights obtained from the memory array 22 to provide a plurality of partial products. In some embodiments, the accumulator circuits 32 include adders, such as adders in an adder tree, which receive the partial products and sum the partial products to produce sum results.

Figure 2:
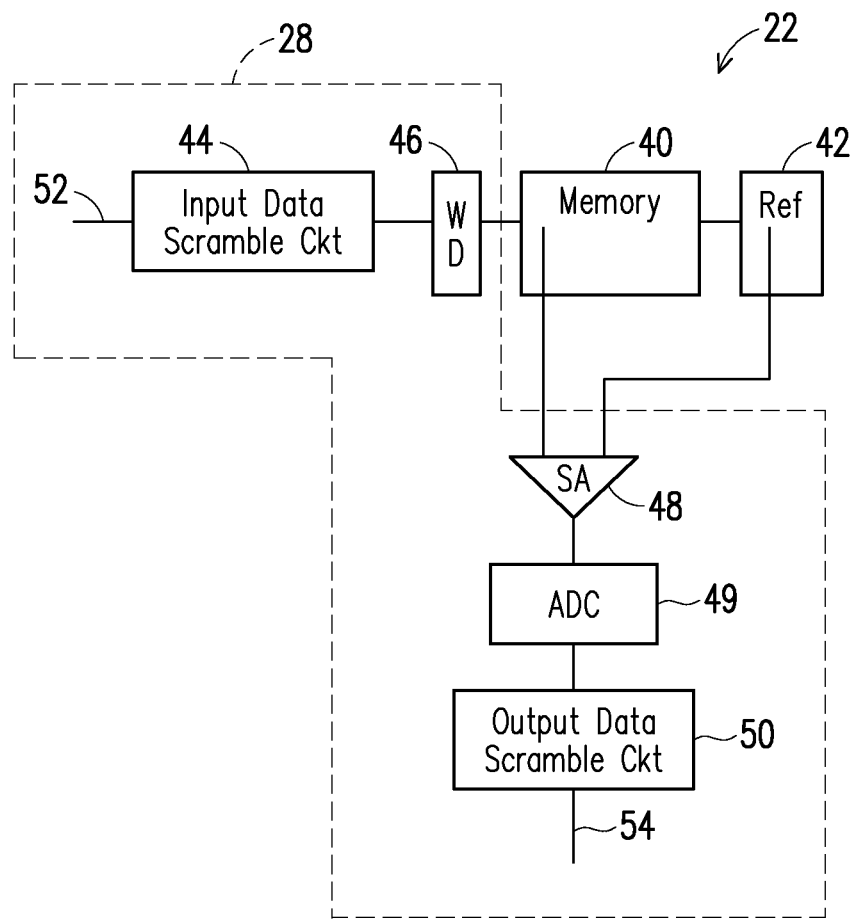
FIG. 2 is a diagram schematically illustrating the memory array and the control circuits for scrambling (encoding) input data and for unscrambling (decoding) data read from the memory array, in accordance with some embodiments.

FIG. 2 is a diagram schematically illustrating the memory array 22 and the control circuits 28 for scrambling (encoding) input data and for unscrambling (decoding) data read from the memory array 22, in accordance with some embodiments. The memory array 22 includes an MLC memory array 40 and reference memory cells 42. The MLC memory array 40 includes MLCs. The reference memory cells 42 are used for sensing and reading the states of the MLCs in the MLC memory array 40.

In some embodiments, for every n bits of data stored in one of the MLCs, the number (2 to the power of n)-1 reference memory cells 42 are used to distinguish the different states of the MLC. The (2 to the power of n)-1 reference memory cells 42 provide (2 to the power of n) intervals between reference threshold voltages. The reference memory cells 42 are precisely programmed with adequately spaced-out threshold voltages for distinguishing the different states of the MLCs. For example, if each of the MLCs stores 2 bits, then three precisely programmed reference memory cells 42 are used to provide three different threshold levels and four intervals between the three threshold voltages. In some embodiments, a word line voltage is applied to the MLC of interest and to the three reference memory cells 42. The current through the MLC is compared to the current through the reference memory cells 42. If the current in the MLC is less than the current in each of the three reference memory cells 42, the bit sequence is "00". If the current in the MLC is greater than the current in each of the three reference memory cells 42, the bit sequence is "11". If the current in the MLC falls between the currents of two of the reference memory cells 42, the bit sequence is "01" or "10". In some embodiments, the MLC memory array 40 is used to store CNN weights, including trained CNN weights.

The MLC memory array 40 includes MLCs configured to store two or more bits of data. In some embodiments, the MLC memory array 40 includes MLCs configured to store two bits of data per memory cell. In some embodiments, the MLC memory array 40 includes MLCs configured to store three bits of data per memory cell. In some embodiments, the MLC memory array 40 includes MLCs configured to store four bits of data per memory cell. In some embodiments, the MLC memory array 40 includes MLCs configured to store more than four bits of data per memory cell.

The control circuits 28 include an input data scramble circuit 44, at least one write driver 46, at least one sense amplifier 48, an ADC circuit 49, and an output data scramble circuit 50. The input data scramble circuit 44 is electrically connected to the write driver 46 that is electrically coupled to the MLC memory array 40. The input data scramble circuit 44 includes an input terminal 52 configured to receive input data, such as CNN weights, to be stored in the MLC memory array 40. The input data scramble circuit 44 is configured to scramble or encode the input data into groups of data bits for storage in the MLC memory array 40. The input data scramble circuit 44 groups together bits of data that are opposite in sensitivity to errors, such as bits with lower error tolerance having a larger negative impact on overall system performance and bits with higher error tolerance having a smaller negative impact on overall system performance. The at least one write driver 46 receives the scrambled data from the input data scramble circuit 44 and writes the scrambled data into the MLCs of the MLC memory array 40.

The at least one sense amplifier 48 is configured to sense voltage/current levels in the MLCs and read the scrambled data out of the MLC memory array 40. The at least one sense amplifier 48 is electrically coupled to the MLC memory array 40 and to the reference memory cells 42. The at least one sense amplifier 48 receives signals from the MLCs on the cell-side and reference signals from the reference memory cells 42 on the reference-side, compares the sensed signals, and provides an output signal to the output data scramble circuit 50. In some embodiment, the signals from the sense amplifier 48 are passed to the ADC circuit 49 and from the ADC circuit 49 to the output data scramble circuit 50.

The output data scramble circuit 50 receives the scrambled data read from the MLC memory array 40 by the sense amplifier 48 and unscrambles (decodes) the scrambled data to provide unscrambled data that is like the input data received at the input terminal 52. The output data scramble circuit 50 is electrically coupled to the output of the sense amplifier 48 and includes an output terminal 54, such that the output data scramble circuit 50 provides the unscrambled data at the output terminal 54.

In some embodiments, the input data scramble circuit 44 provides data scramble techniques that pair together a lower error tolerant bit (an error sensitive bit) with a higher error tolerant bit (an error insensitive bit) to relax memory device reliability requirements and exploit the asymmetric error tolerance of bits in the weights of CNNs. For example, in some embodiments, an 8-bit weight is stored into four 2-bit MLCs, where each MLC stores two bits having opposite error sensitivities, such as (W[7:0], W[6:1], W[5:2], and W[4:3]). If the MLC storing W[7:0] fails, then one lower error tolerant bit W[7] and one higher error tolerant bit W[0] are deemed unreliable or changed, resulting in a medium negative impact on overall system performance. However, if the 8-bit weight is stored in four 2-bit MLCs in the data representation of (W[7:6], W[5:4], W[3:2], W[1:0]) and the MLC storing W[7:6] fails, then two lower error tolerant bits W[7] and W[6] are deemed unreliable or changed, resulting in a larger negative impact on overall system performance. Thus, storing two bits having opposite error sensitivities together, such as in the data representation of (W[7:0], W[6:1], W[5:2], and W[4:3]), relaxes memory device reliability requirements as potential negative impacts are reduced.

Figure 3:
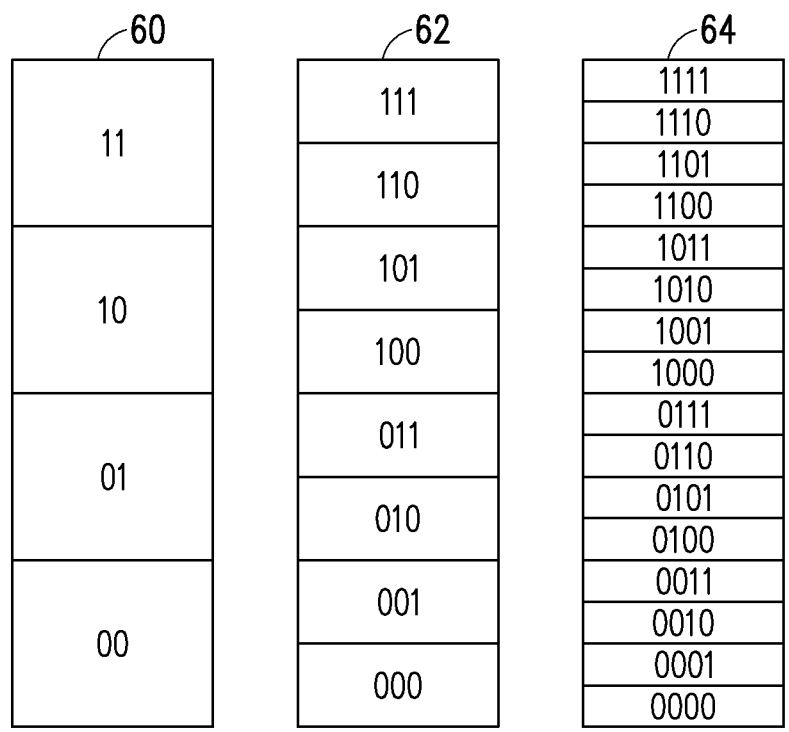
FIG. 3 is a diagram schematically illustrating different MLCs that can be in the MLC memory array, in accordance with some embodiments.

FIG. 3 is a diagram schematically illustrating different MLCs 60, 62, and 64 that can be in the MLC memory array 40, in accordance with some embodiments. As used herein, the abbreviation MLC denotes a multi-level cell that can store two or more bits of data, such that the MLC designation is not limited to memory cells that can store 2-bits of information.

The 2-bit MLC 60, referred to as a double level cell (DLC), is configured to store 2-bits of data having a total of 4 states. The 3-bit MLC 62, referred to as a triple level cell (TLC), is configured to store 3-bits of data having a total of eight states, and the 4-bit MLC 64, referred to as a quad level cell (QLC), is configured to store 4-bits of data having a total of sixteen states.

In some embodiments, each of the MLC's 60, 62, and 64 is a flash memory cell, such as a NAND flash memory cell, configured to store more than 1 bit of data, i.e., more than 2 states, per memory cell. In some embodiments, each of the MLC's 60, 62, and 64 includes a single floating gate mosfet that is configured to store a different amount of charge for each state. For example, to store four states (2 bits of data) in one MLC, the MLC can be not programmed with any charge to provide the "00" state, fully charged to provide the "11" state, partially charged to $\frac{1}{3}$ of the fully charged state to provide the "01" state, and partially charged to $\frac{2}{3}$ of the fully charged state to provide the "10" state. Then, three precisely programmed reference memory cells 42 can be used to provide three different threshold levels and four intervals between the three threshold voltages. A word line voltage can be applied to the MLC of interest and to the three reference memory cells 42, and the current through the MLC compared to the current through the reference memory cells 42. For example, in some embodiments, if the current in the MLC is less than the current in each of the three reference memory cells 42, the bit sequence is "00", if the current in the MLC is greater than the current in each of the three reference memory cells 42, the bit sequence is "11", and if the current in the MLC falls between the currents of two of the reference memory cells 42, the bit sequence is "01" or "10". Thus, one MLC having a single mosfet can store four states, i.e., 2 bits, of data, such that two memory cells each having at least one mosfet, are not needed to store the two bits of data. This reduces the number of mosfets needed to store a particular number of bits of data. In some embodiments, the MLCs 60, 62, and 64 can be MLC phase change memory.

Figure 4:
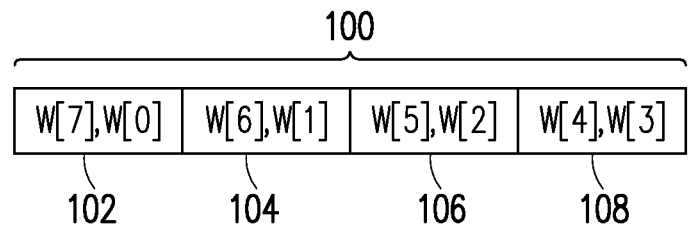
FIG. 4 is a diagram schematically illustrating an 8-bit CNN weight scrambled into bit pairs that include one lower error tolerant bit and one higher error tolerant bit, in accordance with some embodiments.

FIG. 4 is a diagram schematically illustrating an 8-bit CNN weight 100 scrambled into bit pairs 102, 104, 106, and 108 that include one lower error tolerant bit and one higher error tolerant bit, in accordance with some embodiments.

As noted above, in CNN applications, input data is interacted with weights to provide results. In some embodiments, these results are inferences about what is depicted in an image of interest. The CNN learns different images in an iterative learning process by examining many different images and adjusting or updating the weights to distinguish between the different images. This is referred to as training the weights, such that the trained weights, i.e., the iteratively updated weights, provide improved inference results for the CNN.

The trained CNN weights usually exhibit a non-uniform distribution, such that the weights at the center of the distribution have a higher probability of occurring than the weights at the extremes of the distribution. Also, often the trained weights are represented in 2 s complement form, such that the trained weights at the center of the distribution are, basically, centered around zero, i.e., a string of all zero bits. In 2 s complement form, non-negative (positive) integers such as 0 to 7 are represented with the five most significant bits as zeroes and toggling of the three least significant bits, and negative integers such as −1 to −8 are represented with the five most significant bits as ones and toggling of the three least significant bits. This results in many changes to the least significant bits and fewer or no changes in the most significant bits. For example, with an 8-bit weight in 2 s complement form, counting between 0 and 7, the three least significant bits of W[0], W[1], and W[2] change, but the five most significant bits of W[7], W[6], W[5], W[4], and W[3] remain unchanged at all zeroes, and counting between −1 and −8, the three least significant bits of W[0], W[1], and W[2] change, but the five most significant bits of W[7], W[6], W[5], W[4], and W[3] remain unchanged at all ones. With each of the 8-bit CNN weights stored in four 2-bit MLCs in the following data representation (W[7:6], W[5:4], W[3:2], W[1:0]), the bit pattern distribution contains a disproportionate number of 00 and 11 bit patterns in the W[7:6] and W[5:4] 2-bit MLCs. By storing each of the 8-bit CNN weights in four 2-bit MLCs in the following data representation W[7:0], W[6:1], W[5:2], and W[4:3]), the bit pattern pairs, including the 00 and 11 bit patterns, are more evenly distributed in the data representation, which can increase the reliability of the memory device by not having the same bit pattern repeatedly stored in the same MLC.

Each bit of the 8-bit weight has a different impact on the overall inference accuracy of the CNN. Lower error tolerance bits are the most sensitive bits, such that if these bits fail or are inadvertently changed, the failure or change has a larger negative impact on the ability of the system to make a correct inference, such as an inference about the image being depicted. Higher error tolerance bits are the least sensitive bits, such that if these bits fail or are inadvertently changed, the failure or change has a smaller negative impact on the ability of the system to make a correct inference, such as an inference about the image being depicted.

In the CNN 8-bit weight example, the lowest error tolerant bit is W[7] followed by W[6], and so on, down to the highest error tolerant bit of W[0]. Where, a failed or incorrect bit of W[7] has the largest impact on the value of the 8-bit weight and the largest negative impact on the ability of the system to make a correct inference, and a failed or incorrect bit of W[0] has the smallest impact on the value of the 8-bit weight and the smallest negative impact on the ability of the system to make a correct inference. With an 8-bit weight stored in four 2-bit MLCs in the data representation of (W[7:6], W[5:4], W[3:2], W[1:0]), the two lowest error tolerant bits (the two most sensitive bits) of W[7] and W[6] are grouped together and the two highest error tolerant bits (the two least sensitive bits) of W[1] and W[0] are grouped together. This is an unbalanced representation in that if the MLC storing W[7:6] fails, the value of the 8-bit weight is greatly affected and the overall system performance, i.e., the ability of the system to make a correct inference, is greatly affected by the loss of W[7] and W[6], whereas if the MLC storing W[1:0] fails, the value of the 8-bit weight is less affected and the overall system performance, i.e., the ability of the system to make a correct inference, is little affected by the loss of W[1] and W[0].

In the bit distribution of FIG. 4, the 8-bit CNN weight 100 is divided into bit pairs 102, 104, 106, and 108 in an 8-bit pattern of (W[7:0], W[6:1], W[5:2], and W[4:3]). Each of the bit pairs 102, 104, 106, and 108 is stored in a 2-bit MLC and each of the bit pairs 102, 104, 106, and 108 includes a lower error tolerant bit (an error sensitive bit) and a higher error tolerant bit (an error insensitive bit). This makes the reliability requirements of each of the MLCs in the memory device 20 for maintaining consistent system performance of the CNN balanced or about the same. For example, in some embodiments, an 8-bit weight is stored in four 2-bit MLCs, where each MLC stores two bits, one bit having a lower error tolerance and one bit having a higher error tolerance, such as in the data representation of W[7:0], W[6:1], W[5:2], and W[4:3]. With this data representation, if the MLC storing W[7:0] fails or the MLC storing W[4,3] fails, then one lower error tolerant bit (W[7] or W[4]) fails and one higher error tolerant bit (W[0] or W[3]) fails, resulting in a "medium" negative impact on overall system performance. This is opposed to if the 8-bit weight is stored in four 2-bit MLCs in the data representation of W[7:6], W[5:4], W[3:2], W[1:0], where if the MLC storing W[7:6] fails such that the two lower error tolerant bits W[7] and W[6] are deemed unreliable, this results in a "very large" negative impact on overall system performance and if the MLC storing W[1:0] fails such that the two higher error tolerant bits W[1] and W[0] are deemed unreliable, this results in a "very small" negative impact on overall system performance. Thus, storing two bits with one bit having a lower error tolerance and one bit having a higher error tolerance, such as in the data representation of (W[7:0], W[6:1], W[5:2], and W[4:3]), makes it so not one of the MLCs is more important than another MLC in storing bits and not failing, which equalizes or balances the reliability requirements of the MLCs in the memory device 20.

The bit pair 102 includes bits 7 and 0, where, in some embodiments, bit 7 is the lowest error tolerant bit providing the highest error sensitivity and bit 0 is the highest error tolerant bit providing the lowest error sensitivity. The bit pair 104 includes bits 6 and 1, where, in some embodiments, bit 6 is the next lowest error tolerant bit providing the next highest error sensitivity after bit 7 and bit 1 is the next highest error tolerant bit providing the next lowest error sensitivity after bit 0. The bit pair 106 includes bits 5 and 2, where, in some embodiments, bit 5 is the next lowest error tolerant bit providing the next highest error sensitivity after bit 6 and bit 2 is the next highest error tolerant bit providing the next lowest error sensitivity after bit 1, and the bit pair 108 includes bits 4 and 3, where, in some embodiments, bit 4 is the next lowest error tolerant bit providing the next highest error sensitivity after bit 5 and bit 3 is the next highest error tolerant bit providing the next lowest error sensitivity after bit 2. This bit distribution balances the reliability requirements of the memory device 20 and provides a more even or equal (balanced) distribution of the bit patterns of 00, 01, 11, and 10 in the 2-bit MLCs.

Figure 5:
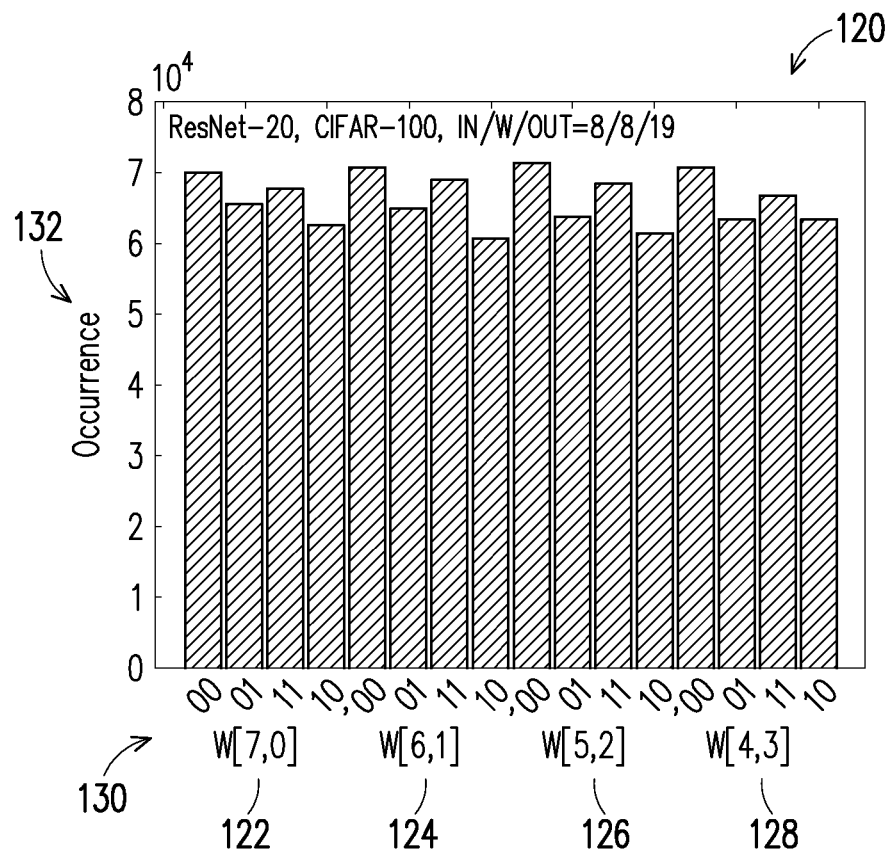
FIG. 5 is a diagram schematically illustrating a more balanced bit pattern distribution in the 2-bit MLCs, in accordance with some embodiments.

FIG. 5 is a graph diagram schematically illustrating a more balanced or even bit pattern distribution 120 in the 2-bit MLCs, in accordance with some embodiments. The x-axis of the graph at 130 indicates the bit patterns 00, 01, 11, and 10 for each of the bit pairs W[7:0] at 122, W[6:1] at 124, W[5:2] at 126, and W[4:3] at 128, and the y-axis of the graph at 132 indicates the number of occurrences of each of the bit patterns 00, 01, 11, and 10 for each of the bit pairs W[7:0] at 122, W[6:1] at 124, W[5:2] at 126, and W[4:3] at 128. The 8-bit CNN weight 100 is divided into the bit pairs 102, 104, 106, and 108, where each of the bit pairs 102, 104, 106, and 108 includes an error sensitive bit and an error insensitive bit and each of the bit pairs 102, 104, 106, and 108 is stored in a 2-bit MLC.

The distribution of the bit patterns 00, 01, 11, and 10 is, basically, even or equal (balanced) for each of the bit pairs W[7:0] at 122, W[6:1] at 124, W[5:2] at 126, and W[4:3] at 128 and from one bit pair to another. Also, with this encoding or scrambling of the 8-bit CNN weights, the reliability requirements of the MLCs in the memory device 20 are more balanced.

Of course, this method is not limited to an 8-bit weight using four two-bit MLC devices. In other embodiments, each CNN weight can be more or less than eight bits, and/or each MLC can store more than two bits.

Figure 6:
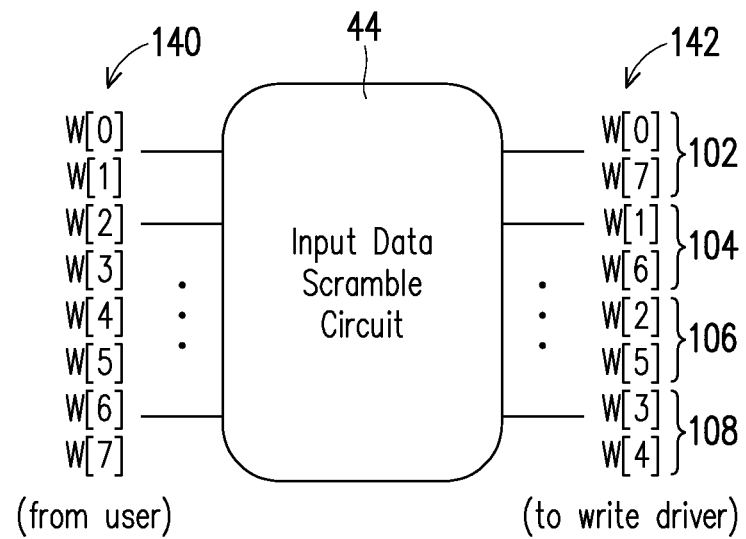
FIG. 6 is a diagram schematically illustrating the input data scramble circuit configured to scramble (encode) input data and provide scrambled data, in accordance with some embodiments.

FIG. 6 is a diagram schematically illustrating the input data scramble circuit 44 configured to scramble (encode) input data 140 and provide scrambled data 142, in accordance with some embodiments. The input data 140 is received at the input terminal 52 of the input data scramble circuit 44 (shown in FIG. 2). The input data 140 is received in bit order, i.e., with the bits in the order of W[0], W[1], W[2], W[3], W[4], W[5], W[6], and W[7]. The input data scramble circuit 44 receives the input data 140 and scrambles the input data 140 into the scrambled data 142 that has a bit order of W[0], W[7], W[1], W[6], W[2], W[5], W[3], and W[4]. The write driver 46 receives the scrambled data 142 and writes the scrambled data into the MLC memory array 40. In some embodiments, the write driver receives the scrambled data 142 as bit pairs 102, 104, 106, and 108 and writes each of the bit pairs 102, 104, 106, and 108 into a 2-bit MLC in the memory array 40.

In some embodiments, the input data scramble circuit 44 is configured to receive the input data 140 in a different bit order. In some embodiments, the input data scramble circuit 44 is configured to encode the input data 140 and provide the scrambled data 142 in a different bit order. In some embodiments, the input data scramble circuit 44 is configured to encode the input data 140 and provide the scrambled data 142 in groups (sets) of at least one of two bits, three bits, four bits, and more than four bits. In some embodiments, the input data scramble circuit 44 is configured to encode the input data 140 and provide the scrambled data 142 in groups (sets) of at least one of two bits, three bits, four bits, and more than four bits for storing the scrambled data 142 in at least one of 2-bit MLCs, 3-bit MLCs, 4-bit MLCs, and more than 4-bit MLCs.

Figure 7:
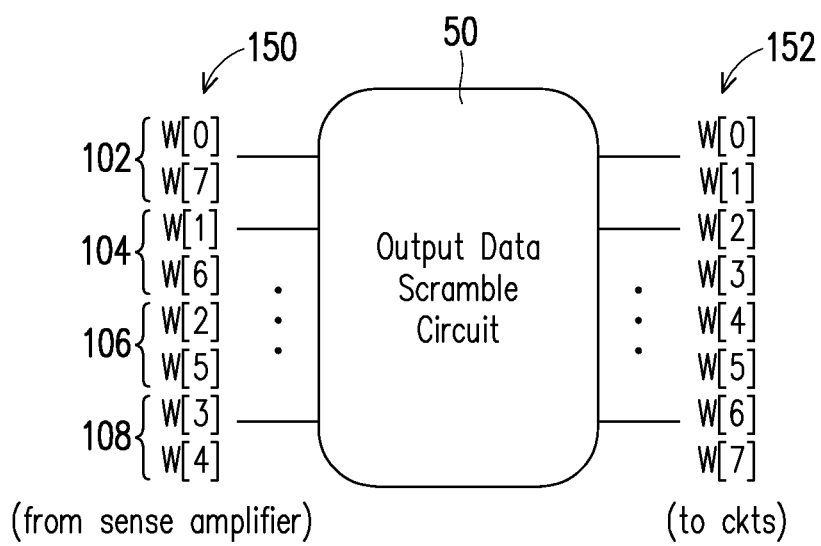
FIG. 7 is a diagram schematically illustrating the output data scramble circuit configured to unscramble (decode) scrambled output data and provide unscrambled output data, in accordance with some embodiments.

FIG. 7 is a diagram schematically illustrating the output data scramble circuit 50 configured to unscramble (decode) scrambled output data 150 and provide unscrambled output data 152, in accordance with some embodiments. The output data 150 is read out of the memory array 40 by the sense amplifier 48 and received by the output data scramble circuit 50 (shown in FIG. 2). The output data 150 is received in the scrambled bit order of W[0], W[7], W[1], W[6], W[2], W[5], W[3], and W[4]. The output data scramble circuit 50 receives the output data 150 from the sense amplifier 48 and unscrambles the output data 150 to provide the unscrambled output data 152 in the bit order of W[0], W[1], W[2], W[3], W[4], W[5], W[6], and W[7] that matches the bit order of the input data 140. The output data scramble circuit 50 provides the unscrambled output data 152 at the output terminal 54 to other circuits in the memory device 20. In some embodiments, the output data scramble circuit 50 receives the output data 150 from the sense amplifier 48 as bit pairs 102, 104, 106, and 108.

In some embodiments, the output data scramble circuit 50 is configured to receive the output data 150 in a different bit order. In some embodiments, the output data scramble circuit 50 is configured to decode the output data 150 and provide the unscrambled output data 152 in a different bit order. In some embodiments, the output data scramble circuit 50 is configured to decode the output data 150 and provide the unscrambled output data 152 in groups (sets) of at least one of two bits, three bits, four bits, and more than four bits.

Figure 8:
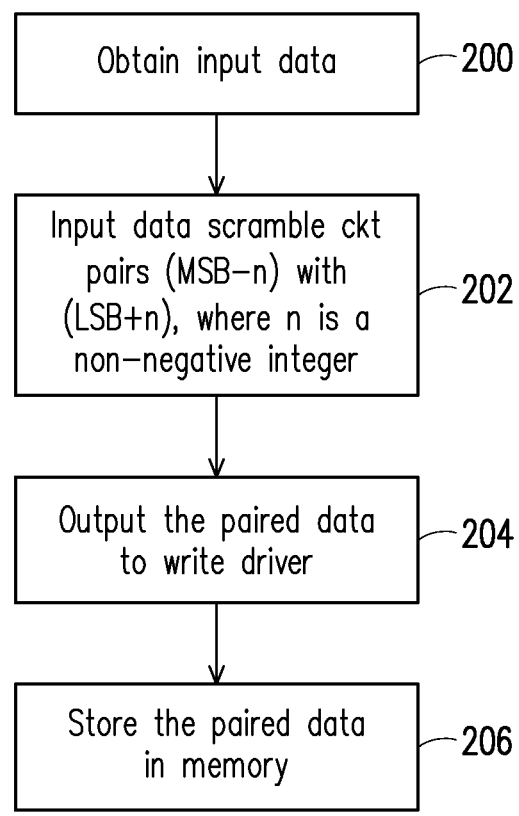
FIG. 8 is a diagram schematically illustrating a method of scrambling input data and writing the scrambled data into an MLC memory array to balance memory reliability requirements, in accordance with some embodiments.

FIG. 8 is a diagram schematically illustrating a method of scrambling input data and writing the scrambled data into an MLC memory array to balance memory reliability requirements, in accordance with some embodiments. In some embodiments, the input data is like the input data 140. In some embodiments, the input data are CNN weights. In some embodiments, the input data is scrambled by the input data scramble circuit 44 and written into the MLC memory array by the write driver 46. In some embodiments, the MLC memory array is like the memory array 40. In some embodiments, the MLC memory array is situated above device circuits in a CIM device.

At 200, the method includes obtaining the input data, such as obtaining the input data from a user or another part of an electronic system. In some embodiments, the input data 140 is received at the input terminal 52 of the input data scramble circuit 44. In some embodiments, the input data is received in bit order, i.e., with the bits in the order of W[0], W[1], W[2], W[3], W[4], W[5], W[6], and W[7]. In some embodiments, obtaining the input data includes obtaining CNN weights.

At 202, the method includes the input data scramble circuit, such as the input data scramble circuit 44, receiving the input data and scrambling the input data by pairing the most significant bit minus n (MSB-n) with the least significant bit plus n (LSB+n), where n is a non-negative integer, such as a non-negative integer from 0 to 3. In some embodiments, the bit pairs are like bit pairs 102, 104, 106, and 108. In some embodiments, the bit pairs are in the bit order of W[7,0]; W[6,1]; W[5,2]; and W[4,3]. In some embodiments, the bit pairs are in the bit order of W[0,7]; W[1,6]; W[2,5]; and W[3,4].

At 204, the method includes outputting the paired data to the write driver, such as the write driver 46. The write driver receives the scrambled data, such as the scrambled data 142, and, at 206, the write driver stores the scrambled data into the MLC memory array, such as the memory array 40. In some embodiments, the write driver receives the scrambled data as bit pairs 102, 104, 106, and 108 and writes each of the bit pairs 102, 104, 106, and 108 into a 2-bit MLC in the memory array 40.

Figure 9:
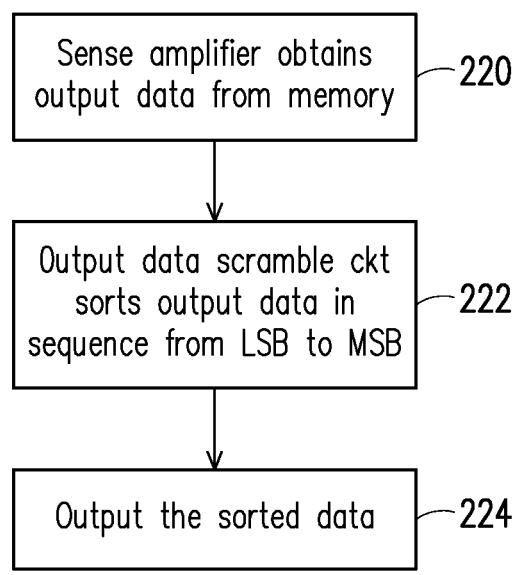
FIG. 9 is a diagram schematically illustrating a method of reading scrambled data from an MLC memory array and unscrambling (decoding) the scrambled output data to provide sorted, unscrambled output data, in accordance with some embodiments.

FIG. 9 is a diagram schematically illustrating a method of reading scrambled data from an MLC memory array and unscrambling (decoding) the scrambled output data to provide sorted, unscrambled output data, in accordance with some embodiments. In some embodiments, the scrambled output data is like the scrambled output data 150. In some embodiments, the scrambled output data are scrambled CNN weights. In some embodiments, the scrambled output data 150 are read from the memory array 40 by sense amplifier 48 and unscrambled by the output data scramble circuit 50 to provide the unscrambled output data 152. In some embodiments, the MLC memory array is like the memory array 40. In some embodiments, the MLC memory array is situated above device circuits in a CIM device.

At 220, the method includes the sense amplifier, such as the sense amplifier 48, obtaining the scrambled output data, such as the scrambled output data 150, from the MLC memory array, such as the memory array 40. In some embodiments, the scrambled output data is received in the scrambled bit order of W[0], W[7], W[1], W[6], W[2], W[5], W[3], and W[4]. In some embodiments, the scrambled output data is received in the scrambled bit order of W[7], W[0], W[6], W[1], W[5], W[2], W[4], and W[3]. In some embodiments, the scrambled output data 150 is read out of the memory array 40 by the sense amplifier 48 and received by the output data scramble circuit 50. In some embodiments, the scrambled output data 150 is read out of the memory array 40 by the sense amplifier 48 and received by the output data scramble circuit 50 as bit pairs 102, 104, 106, and 108.

At 222, the method includes the output data scramble circuit, such as the output data scramble circuit 50, receiving the scrambled output data from the sense amplifier and unscrambling or sorting the scrambled output data into a sequence from LSB to MSB. The output data scramble circuit unscrambles or sorts the scrambled output data to provide the unscrambled output data, such as the unscrambled output data 152. In some embodiments the unscrambled output data is in the sequence of W[0], W[1], W[2], W[3], W[4], W[5], W[6], and W[7]. Also, in some embodiments, the unscrambled output data is in the same sequence as the bit order of the input data 140.

At 224, the output data scramble circuit, such as the output data scramble circuit 50, provides the unscrambled output data, such as the unscrambled output data 152. In some embodiments, the output data scramble circuit 50 provides the unscrambled output data 152 at the output terminal 54 to other circuits in the memory device 20.

In some embodiments, the output data scramble circuit is configured to receive the output data in a different bit order. In some embodiments, the output data scramble circuit is configured to decode the output data and provide the unscrambled output data in a different bit order. In some embodiments, the output data scramble circuit is configured to decode the output data and provide the unscrambled output data in groups (sets) of at least one of two bits, three bits, four bits, and more than four bits.

Disclosed embodiments thus provide scrambling (encoding) of input data, storing scrambled data in an MLC memory array, reading the scrambled data from the MLC memory array, and unscrambling (decoding) the data read from the MLC memory array to provide unscrambled output data to balance memory device reliability requirements. Disclosed embodiments group together bits of data that are opposite in sensitivity to errors, where errors on bits with lower error tolerance have a larger negative impact on overall system performance and errors on bits with higher error tolerance have a smaller negative impact on overall system performance. Also, in some embodiments, the input data are CNN weights.

Disclosed embodiments further include grouping lower error tolerant bits with higher error tolerant bits, which exploits the asymmetric error tolerance of bits in the CNN weights. For example, by storing an 8-bit weight in four 2-bit MLCs, where each MLC stores two bits having opposite error sensitivities, such as (W[7:0], W[6:1], W[5:2], and W[4:3]), memory device reliability requirements are balanced. Also, the number of MLCs having each of the bit patterns of 00, 01, 11, and 10 is balanced. Also, in some embodiments, the systems and methods are not limited to an 8-bit weight using four two-bit MLC devices. In other embodiments, the CNN weights can be more or less than eight bits and/or each MLC can store more than two bits.

In accordance with some embodiments, a system includes a memory cell array including multi-level cells, an input data scramble circuit configured to receive input data and match lower error tolerant bits with higher error tolerant bits to provide matched bit sets, wherein each of the matched bit sets includes at least one lower error tolerant bit and at least one higher error tolerant bit, and a write driver configured to receive the matched bit sets and store each of the matched bit sets into one memory cell of the multi-level cells.

In accordance with further embodiments, a system includes a memory cell array including multi-level cells, an input data scramble circuit configured to receive input data and pair an MSB-n bit of the input data with an LSB+n bit of the input data to provide pairs of bits, where n is a non-negative integer, a write driver configured to receive the pairs of bits and store each pair of bits of the pairs of bits in a multi-level cell of the multi-level cells, a sense amplifier configured to sense the pairs of bits from the multi-level cells to provide sensed pairs of bits, and an output data scramble circuit that sorts the sensed pairs of bits in sequence from LSB to MSB and outputs the sorted data.

In accordance with still further disclosed aspects, a method includes obtaining input data; pairing, by an input data scramble circuit, an MSB-n of the input data with an LSB+n of the input data, where n is a non-negative integer; outputting the paired data to a write driver; and storing the paired data in multi-level cells of a memory cell array.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A convolutional neural network system, comprising:
a memory cell array including multi-level cells configured to store convolutional neural network weights;
an input data scramble circuit configured to receive input data that includes convolutional neural network weights that each have a most significant bit that is a highest order bit in the convolutional neural network weight and a least significant bit that is a lowest order bit in the convolutional neural network weight and the input data scramble circuit is configured to match higher order bits that are lower error tolerant bits that if inadvertently changed have a larger negative impact on inferences made by the convolutional neural network system with lower order bits that are higher error tolerant bits that if inadvertently changed have a smaller negative impact on inferences made by the convolutional neural network system to provide matched bit sets,
wherein the input data scramble circuit is configured to store in one memory cell of the multi-level cells the most significant bit of the convolutional neural network weight and the least significant bit of the convolutional neural network weight, such that if the one memory cell is inadvertently changed the impact on the inferences is between the larger impact of the most significant bit and the smaller impact of the least significant bit, and the input data scramble circuit is configured to store in other memory cells of the multi-level cells the most significant bit minus n of the convolutional neural network weight and the least significant bit plus n of the convolutional neural network weight, where n is a non-negative integer, such that one of the other multi-level cells is inadvertently changed the impact on the inferences is between the larger impact of the higher order bit and the smaller impact of the lower order bit; and a write driver configured to receive the matched bit sets and store each of the matched bit sets into a memory cell of the multi-level cells.

2. The system of claim 1, wherein each of the matched bit sets includes two bits of data.

3. The system of claim 1, wherein each of the matched bit sets includes three or more bits of data.

4. The system of claim 1, wherein each of the multi-level cells is configured to store two bits of data.

5. The system of claim 1, wherein each of the multi-level cells is configured to store three or more bits of data.

6. The system of claim 1, comprising:
a sense amplifier configured to sense the matched bit sets from the multi-level cells and provide sensed output data; and
an output data scramble circuit configured to receive the sensed output data from the sense amplifier and sort the sensed output data into a sequence extending from a least significant bit to a most significant bit.

7. The system of claim 1, wherein the input data scramble circuit is configured to pair the most significant bit minus n and the least significant bit plus n, where n is a non-negative integer, of each of the convolutional neural network weights to provide pairs of bits, wherein each of the matched bit sets includes only one pair of bits.

8. The system of claim 7, wherein the write driver is configured to receive the pairs of bits and store each pair of bits of the pairs of bits in one of the multi-level cells.

9. The system of claim 8, wherein the sense amplifier is configured to sense the pair of bits from each of the multi-level cells and provide sensed pairs of bits, and the output data scramble circuit is configured to receive the sensed pairs of bits from the sense amplifier and sort the sensed pairs of bits into a sequence extending from the least significant bit to the most significant bit.

10. The system of claim 1, comprising a compute-in-memory device that includes memory device circuits that are front-end-of-line circuits physically situated under the memory cell array that is a back-end-of-line memory array.

11. The system of claim 1, wherein the input data includes only the convolutional neural network weights.

12. A convolutional neural network system, comprising:
a memory cell array including multi-level cells configured to store convolutional neural network weights;
an input data scramble circuit configured to receive input data that includes convolutional neural network weights that each have a most significant bit that is a highest order bit in the convolutional neural network weight and a least significant bit that is a lowest order bit in the convolutional neural network weight and the input data scramble circuit is configured to pair the most significant bit minus n and the least significant bit plus n, where n is a non-negative integer, of the convolutional neural network weights to provide pairs of bits;
a write driver configured to receive the pairs of bits and store each pair of bits of the pairs of bits in a multi-level cell of the multi-level cells;
a sense amplifier configured to sense the pairs of bits from the multi-level cells to provide sensed pairs of bits; and
an output data scramble circuit that sorts the sensed pairs of bits in sequence from the least significant bit to the most significant bit and outputs the sorted data.

13. The system of claim 12, wherein each of the multi-level cells is configured to store one pair of bits.

14. The system of claim 12, wherein each of the multi-level cells is configured to store more than one pair of bits.

15. The system of claim 12, comprising a compute-in-memory device that includes memory device circuits that are front-end-of-line circuits physically situated under the memory cell array that is a back-end-of-line memory array, wherein the input data induces only the convolutional neural network weights.

16. A method, comprising:
obtaining input data that includes convolutional neural network weights that each have a most significant bit that is a highest order bit in the convolutional neural network weight and a least significant bit that is a lowest order bit in the convolutional neural network weight;
pairing, by an input data scramble circuit, the most significant bit minus n and the least significant bit plus n, where n is a non-negative integer, of the convolutional neural network weights;
outputting the paired data to a write driver; and
storing the paired data in multi-level cells of a memory cell array.

17. The method of claim 16, comprising:
sensing paired data from the multi-level cells of the memory cell array by one or more sense amplifiers;
sorting the sensed paired data into a sequence from the least significant bit to the most significant bit by an output data scramble circuit; and
outputting the sorted data.

18. The method of claim 17, wherein sensing paired data includes comparing current through one of the multi-level cells to current through multiple reference cells.

19. The method of claim 16, wherein pairing comprises pairing an 8-bit data input into pairs of W[7,0]; W[6,1]; W[5,2]; and W[4,3].

20. The method of claim 16, wherein obtaining input data comprises obtaining only convolutional neural network weights.

* * * * *